(12) United States Patent
Zamprogno et al.

(10) Patent No.: US 10,505,527 B2
(45) Date of Patent: Dec. 10, 2019

(54) CURRENT STEERING CIRCUIT, CORRESPONDING DEVICE, SYSTEM AND METHOD

(71) Applicant: STMicroelectronics S.r.l., Agrate Brianza (MB) (IT)

(72) Inventors: Marco Zamprogno, Cesano Maderno (IT); Alireza Tajfar, Milan (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/221,855

(22) Filed: Dec. 17, 2018

(65) Prior Publication Data

US 2019/0199338 A1    Jun. 27, 2019

(30) Foreign Application Priority Data

Dec. 22, 2017    (IT) ........................ 102017000148935

(51) Int. Cl.
| | |
|---|---|
| *H03K 17/041* | (2006.01) |
| *H03K 17/687* | (2006.01) |
| *H03M 1/06* | (2006.01) |
| *H03K 17/0812* | (2006.01) |
| *H03K 19/08* | (2006.01) |

(Continued)

(52) U.S. Cl.
CPC . *H03K 17/04106* (2013.01); *H03K 17/08122* (2013.01); *H03K 17/6871* (2013.01); *H03K 19/08* (2013.01); *H03M 1/06* (2013.01); *G03B 21/2033* (2013.01); *H03M 1/66* (2013.01)

(58) Field of Classification Search
None
See application file for complete search history.

(56) References Cited

U.S. PATENT DOCUMENTS

| | | | |
|---|---|---|---|
| 5,548,238 A | 8/1996 | Zhang et al. | |
| 6,559,784 B1 * | 5/2003 | Schofield | H03K 17/04106 327/108 |

(Continued)

FOREIGN PATENT DOCUMENTS

| | | |
|---|---|---|
| EP | 1366568 A1 | 12/2003 |
| EP | 1769974 A1 | 4/2007 |

OTHER PUBLICATIONS

IT Search Report and Written Opinion for IT Appl. No. 102017000148935 dated Aug. 9, 2018 (9 pages).

(Continued)

*Primary Examiner* — Howard Williams
(74) *Attorney, Agent, or Firm* — Crowe & Dunlevy

(57) ABSTRACT

A circuit includes a first transistor and a second transistor having respective control terminals coupled to receive first and second bias voltages. A first electronic switch is coupled in series with, and between current paths of the first and second transistors to provide an output current line between a circuit output node and ground. A second electronic switch is selectively activated to a conductive state in order to provide a charge transfer current path between a bias node and a charge transfer node in the output current line. A third electronic switch is selectively activated to a conductive state in order to provide a charge transfer current path between the charge transfer node and the control terminal of the second transistor.

24 Claims, 2 Drawing Sheets

(51) Int. Cl.
*G03B 21/20* (2006.01)
*H03M 1/66* (2006.01)

(56) References Cited

U.S. PATENT DOCUMENTS 7,138,855 B2   11/2006  Herz et al.
7,629,910 B2 *  12/2009  Ramadoss ........... H03M 1/0881
                                                      341/136

OTHER PUBLICATIONS

Takakura, Hiroshi et al: "A 10 bit 80MHz Glitchless CMOS D/A Converter," IEEE, 1991, Custom Integrated Circuits Conf. (CICC) (4 pages).

* cited by examiner

CURRENT STEERING CIRCUIT, CORRESPONDING DEVICE, SYSTEM AND METHOD

PRIORITY CLAIM

This application claims the priority benefit of Italian Application for Patent No. 102017000148935, filed on Dec. 22, 2017, the content of which is hereby incorporated by reference in its entirety to the maximum extent allowable by law.

TECHNICAL FIELD

The description relates to steering current Digital to Analog Converter (DAC) design, for use e.g. in Laser Diode Drivers (LDD).

BACKGROUND

Laser diodes for pico-projector applications are conventionally driven through a programmable current source, e.g. a DAC. Rise/fall times and settling time of an output current are comprised in parameters that may be used to define the quality of the projection, and designing the DACs in order to meet these specifications is desired.

Conventional DAC circuits may comprise multiple output current terminals, e.g. a positive and negative output terminal, which may be controlled by corresponding switching transistors, which may selectively couple the output current terminals to a current source, e.g. cascoded current source transistors. The switching transistors may be selectively activated and deactivated, by means of a digital control signal, to provide current at the positive and negative output terminals.

The switching transistors may selectively couple the positive and negative output terminals to the current source, e.g. through a common node.

It has been observed that such conventional circuits, however, may exhibit one or more of the following drawbacks:
- the control terminals (e.g. gates) of the current source transistors may require a constant bias voltage applied thereto, thereby keeping a constant current flow,
- if both the switching transistors are simultaneously OFF, the common node connecting the current paths of the switching transistors is (rapidly) discharged and it may require a non-negligible period of time to recharge; accordingly, the switching transistors are driven in order to avoid that both switching transistors are simultaneously off,
- there is a constant DC power dissipation, and/or
- turn on/off of the switching transistors may cause a glitch in the output current, due to stray capacitances active between the control terminal of each switching transistor and the corresponding output terminal coupled thereto, e.g. between gate and drain in case of MOSFET switching transistors.

Such a conventional circuit was modified, and further solutions are known for example from document H. Takakura et al.: "A 10 bit 80 MHz glitchless CMOS D/A converter", IEEE, 1991, Custom Integrated Circuits Conf. (CICC), incorporated by reference. It was observed that the solution disclosed by Takakura, comprising switching transistors, aims to reduce a current feedthrough occurring, due to the stray capacitances, between the control terminals of the switching transistors and corresponding output terminals coupled to the switching transistors. Also, a reduction of switching noise caused by the switching transistors may be achieved and a settling time of the DAC converter may be improved. However, it was observed that the solution may lead to a reduced output voltage swing.

Also, U.S. Pat. No. 7,138,855 (EP 1366568 B1), incorporated by reference, teaches a circuit where, during power-off transients of an output current, a stray capacitance may couple a step-down voltage to a node coupled to a current source transistor. In such case, the step-down voltage increases a voltage regulating the current passing through the current source transistor (e.g. increases the gate-source voltage in case of FET transistors) and produces a spike in the output current, with the generated spike in the current that discharges the stray capacitance.

U.S. Pat. No. 7,138,855 aims at providing an improved solution with respect to circuits according to the prior art, for switching a current off without inducing an overcurrent event and discloses, in order to reduce occurrence of overcurrent, an arrangement wherein a switch is introduced parallel to the capacitance, which, if active, short circuits and discharges the stray capacitance. The discharge current, therefore, does no longer produce a current spike in the output current and is not transmitted to a load.

Also, if the bias voltage applied to the control terminal of the current source transistor is lower than the sum of the threshold voltages of the current source transistor and a switching transistor, then the voltage regulating the current passing through the switching transistor (e.g. the gate-source voltage thereof) may reach the threshold voltage, and if such voltage is lower than the threshold voltage of the switching transistor then the current source transistor switches off.

Ka-Hou Ao Leong et al., "Design of a 1-V 10-bit 120-MS/s Current-Streering DAC with Transient-Improved Technique", RIUPEEEC, 2006, incorporated by reference, discloses a cascode-switch current source (CSCS) circuit. The Leong reference aims at reducing a distortion which may be due to a falling settling time being different than a rising settling time for an output current. It was observed that:
- when the switching transistors present in the document are off, respective nodes, coupled to their current paths, may be exponentially charged until further transistors, similarly coupled to the respective nodes, enter in the subthreshold region;
- stray capacitances may be also present at the respective nodes, which may further extend the transient(s); and
- a Charge-Removal-Replacement (CRR) topology provides the charge that may be required to settle faster the respective nodes.

Also, it was observed that one or more timing advantages due to a better settling of the node may be present, e.g.:
- a balanced speed and advanced transition: due to the absence of an exponential discharge for the cascode, a balanced falling and rising speed may be obtained;
- recovered synchronization for each current source: the respective nodes may require same settling time (charging time) during each clock cycle, thus no delay difference among active current paths and no input-data-dependent non-linearity are present; and
- susceptibility to asynchronous glitches may decrease.

However, it was observed that the circuit may exhibit one or more disadvantages, e.g. precise CRR capacitances may be desired.

Further DAC circuits were observed, for example a circuit exemplified in document U.S. Pat. No. 5,548,238, incorporated by reference, which aims at reducing consumption in idle mode. In conventional DACs, an idle current is steered to ground, thereby leading to a high power consumption in idle mode. In the document, however, the current path may be switched off, thereby possibly achieving no power consumption in idle mode.

In the exemplified DAC, it may be possible to turn on a current source transistor in order to establish a stable current and to bias all the nodes related thereto, before turning to an "on" mode the DAC. In order to achieve a smooth transition, the current steering circuitry may be turned to the "on" mode after the current source transistor is turned on.

Conversely, the transition from "on" to "off" mode is achieved by first steering the current to ground and then cutting off the current source transistor.

It was also observed that two capacitors may be introduced in the DAC circuit, in order to compensate the distortion on the bias voltages caused by coupling with stray capacitors (e.g. stray capacitors between drain and gate of MOSFET transistors, e.g. the current source transistor) during the current source switching.

SUMMARY

There is a need in the art for a current steering DAC that meets one or more of the following characteristics: high dynamic performance with sharp rise/fall times (in the order of hundreds of picoseconds—1 ps=$10^{12}$ s); high speed switching rate with a fast settling time (10 bits resolution up to 300 MHz sampling frequency); high current swing with output full scale programmed at 10 bits resolution; and/or low power with substantially no power consumption for the non-selected generators of the DAC.

One or more embodiments may comprise a corresponding device (e.g. an LDD—laser diode driver device, e.g. for pico-projector applications), a corresponding system (e.g. laser diode driver devices plus laser diodes) and a corresponding method of driving a circuit according to one or more embodiments.

IN an embodiment, a circuit comprises: a first transistor and a second transistor having respective control terminals and current paths therethrough, the control terminal of the first transistor coupled to a first bias voltage node and the control terminal of the second transistor coupled to a second bias voltage node; a first electronic switch having a selectively activatable current path therethrough; wherein the current paths through the first and second transistor and the current path through the first electronic switch are cascaded in an output current line between a circuit output node and ground, the output current line having an intermediate portion between the first and second transistor with a charge transfer node in the intermediate portion.

The circuit may comprise: a second electronic switch arranged between a third bias voltage node and the charge transfer node, and a third electronic switch arranged between the charge transfer node and the control terminal of the second transistor, the second electronic switch and the third electronic switch selectively activatable to a conductive state to provide charge transfer current paths coupling the charge transfer node to the third bias voltage input node or the second bias voltage input node, respectively.

In one or more embodiments, the first electronic switch is arranged in the portion of the output current line between the first transistor and the second transistor.

In one or more embodiments, the first electronic switch is arranged in a respective portion of the output current line between the circuit output node and the second transistor or between the first transistor and ground.

In one or more embodiments, the circuit comprises at least one of: a first capacitor between the control terminal of the first transistor and a node sourcing an inverted replica of the control signal, and/or a second capacitor between the control terminal of the third transistor and a node sourcing the control signal.

In one or more embodiments, the first and second transistor and the first, second and third electronic switches comprise field effect transistors, such as MOSFET transistors, having gate control terminals and source-drain current paths therethrough.

Also, in one or more embodiments, the first and second transistor and the first, second and third electronic switches comprise field effect transistors having their bulk terminals coupled to ground.

In an embodiment, a device comprises: at least one circuit as disclosed above which is configured to provide an output current via the output current line between the output node and ground of the at least one circuit, and at least one driver circuit coupled to the at least one circuit to provide the control signal to selectively activate the first switch as well as activation signals to selectively activate the second switch and the third switch.

In an embodiment, a system comprises: the device as disclosed above, and at least one user component, optionally a laser diode, coupled to the device to receive therefrom the at least one output current.

One or more embodiments may further relate to a method of driving any of the circuit, the device or the system as disclosed above. The method comprises: selectively activating the first electronic switch to the conductive state synchronously with an on-off control signal having rising edges and falling edges, and selectively activating the second electronic switch and the third electronic switch to the conductive state synchronously with the rising edges and falling edges of the on-off control signal selectively activating the first electronic switch.

Also, the method comprises: activating the second electronic switch to the conductive state at the rising edges of the on-off control signal selectively activating the first electronic switch, and activating the second electronic switch to the conductive state at the falling edges of the on-off control signal selectively activating the first electronic switch.

The method further comprises maintaining the second electronic switch and the third electronic switch to a non-conductive state over an interval between the rising edges and the falling edges of the on-off control signal selectively activating the first electronic switch.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

A solution according to one or more embodiments may improve rise/fall times and settling time of an output current of a steering current digital-to-analog converter, DAC, suitable to operate with a large output full-scale range and without consumption in case of non-selection of the current generator itself.

One or more embodiments, exemplified in the following figures, may relate to high-speed, high-power and high current swing switched-cascode current mirrors.

One or more embodiments may relate to a current steering cell exhibiting one or more of the following features:
- a high output FSR—full scale range—current swing (e.g. $I_{OUT,FSmax}$ being about $1000 \cdot I_{OUT,FSmin}$): the output current IOUT may be programmed accordingly to DAC input data, e.g. from 0 to a full-scale value with a given, i.e. 10b, resolution, the full-scale value may be also independently programmed between a minimum and a maximum value,
- a high switching rate (FSW—switching frequency of about 300 MHz),
- low rise/fall time ($T_{rise/fall}$ of about 500 ps), and
- low power consumption.

Figure 1:
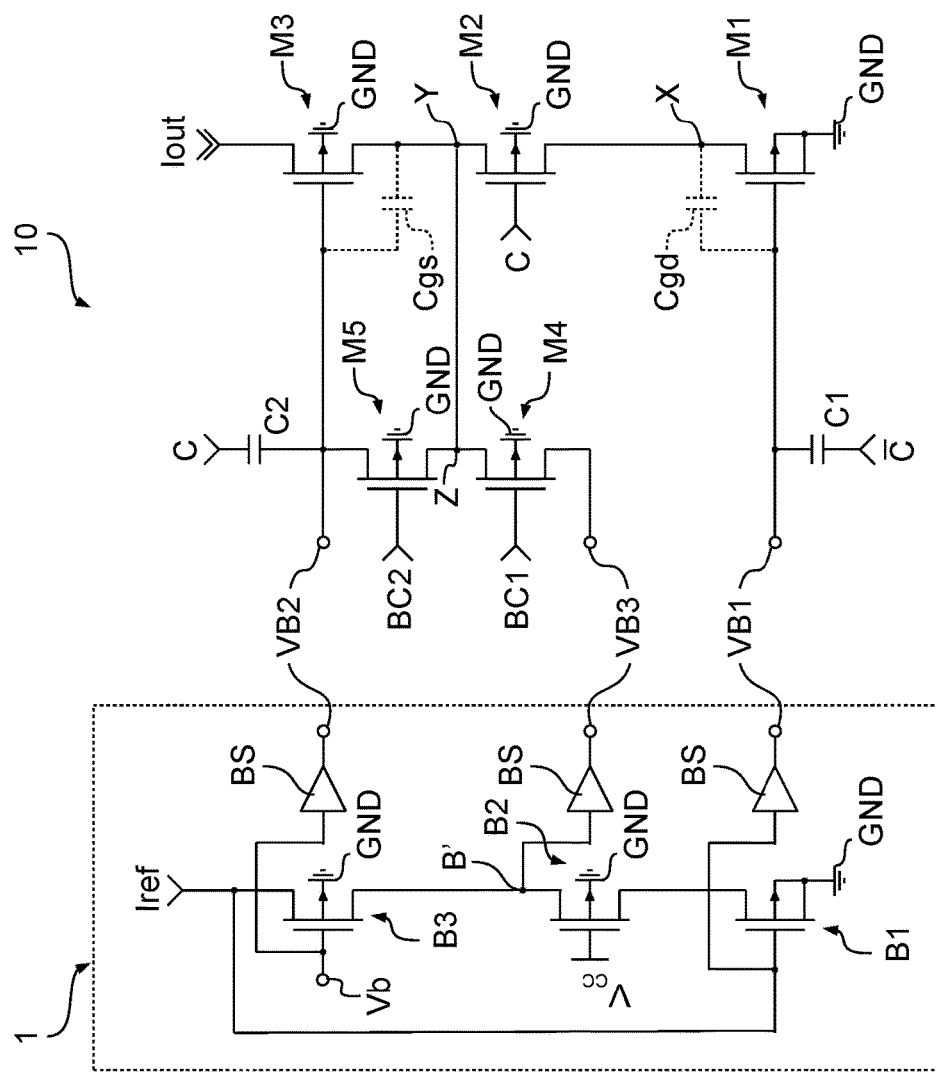
FIG. 1 is exemplary of a circuit according to one or more embodiments.

FIG. 1 exemplifies a circuit 10 according to one or more embodiments. The left portion of FIG. 1, represents a possible implementation of a bias circuit 1 producing first, second and third bias voltages to the circuit 10 at respective first, second and third bias voltage nodes VB1, VB2 and VB3.

The bias circuit 1 may comprise a reference current line, between a current reference node Iref, to which a desired output FSR current may be applied, and ground GND.

A first, second and third bias transistors B1, B2 and B3 may be present, having control terminals (e.g. gate terminals in case of FET transistors) coupled to the current reference node Iref, a first voltage node $V_{CC}$ and a second voltage node Vb, respectively. The voltage nodes may apply DC biasing signals to the control terminals of the bias transistors.

Also, current paths through the first, second and third bias transistors B1, B2 and B3 may be arranged cascoded in the reference current line between the current reference node Iref and ground GND.

The first bias voltage node VB1 may be coupled to a buffer stage BS, which in turn may be connected (e.g. directly) to the control terminal of the first bias transistor B1. The second bias voltage node VB2 may be coupled to a buffer stage BS, which in turn may be connected (e.g. directly) to the control terminal of the third bias transistor B3. The third bias voltage node VB3 may be coupled to a buffer stage BS, which in turn may be connected (e.g. directly) to a node B' of the current line, arranged intermediate of the current paths of the second and third bias transistors B2 and B3.

The bias voltages may be therefore provided to the circuit 10, wherein the bias circuit 1 may provide a "replica" of the current generator branch of circuit 10. For example, the third bias voltage provided at the third bias voltage node VB3 may provide a replica of the voltage at an intermediate node (e.g. a second intermediate node Y) when the current generator of the circuit 10 is active.

In FIG. 1, an output current line between an output current node Iout and ground GND may be present, wherein the current path of a current source transistor M1, an electronic switch (e.g. a switching transistor) M2 and a cascode transistor M3 may be arranged in the output current line. Each transistor may have a control terminal plus a current path therethrough.

In one or more embodiments, the current source transistor M1 may be configured for generating an output current, the electronic switch M2 may be configured for controlling the current source (for switching it on and off) and the cascode transistor M3 may be configured for improving an output impedance and, e.g. in case of use with high-voltage devices, for facilitating achieving protection against a voltage at the output current node Iout that may overcome a Safe-Operating-Area for the remaining components in the output current line of the circuit 10, e.g. M1, M2.

For example, for applications in the field of current generators for laser drivers, the voltage at the output current node Iout may rise to a high voltage (e.g. 10-12 V) that may depend on certain features of laser diodes, for example on forward voltage, power supply and/or inductive ringing thereof. However, to facilitate achieving high switching speeds, the current generator active devices (e.g. transistor M1, switch M2) may be designed with certain technological options that may lead to such devices not being able to sustain high voltages and the cascode transistor M3 may be used to provide protection with respect to the high voltage on the output current node Iout.

The current source transistor M1, the electronic switch M2 and the cascode transistor M3 may be arranged cascoded, i.e. with current paths therethrough coupled in series.

In one or more embodiments, the current path of the current source transistor M1 may be connected to ground GND and to a first intermediate node X, the current path of the electronic switch (e.g. a switching transistor) M2 may be arranged in an intermediate portion of the output current line between the current source transistor M1 and the cascode transistor M3, e.g. the switching transistor M2 may be connected to the first intermediate node X and to a second intermediate node Y, and the current path of the cascode transistor M3 may be connected to the second intermediate node Y and the output current node Iout.

Conversely, in one or more embodiments, the current path of the electronic switch (e.g. a switching transistor) M2 may be arranged between the current source transistor M1 and ground GND, or optionally between the output current node Iout and the cascode transistor M3. In such embodiments, the first intermediate node X and the second intermediate node Y may be (e.g. directly) connected.

For example, providing the electronic switch M2 between the current source transistor M1 and the cascode transistor M3 may facilitate overcoming matching and speed limitation issues.

It will also be appreciated that, to comply with the specifications that may be desired for the output current Iout, e.g. a power consumption, the current source transistor M1 and the cascode transistor M3 (plus optionally the switching transistor M2) may be sized according to a minimum available headroom voltage and a maximum full-scale. As a consequence, in case minimum full-scale is selected, the current source transistor M1 and the cascode transistor M3 may operate in weak-inversion, and large parasitic capacitances associated thereto may be charged and discharged with the low currents. The stray (and parasitic) capacitances may be relevant to operation of the circuit 10 and may affect dynamic performances (rise/fall and settling time of the output current).

In one or more embodiments, the control terminal of the current source transistor M1 may be coupled to the first bias voltage node VB1, and the control terminal of the cascode transistor M3 may be coupled to the second bias voltage node VB2. Also, the electronic switch M2 may selectively switch to a conductive state as a function of a control signal C. For example, in case the electronic switch M2 may comprise a switching transistor, the control terminal of the switching transistor M2 may be (e.g. directly) connected to a control node, providing the control signal C. The control signal C may include an on-off signal, e.g. a digital signal switching between a high value (e.g. 1) and a low value (e.g. 0).

In one or more embodiments, current paths of a first M4 and second M5 active bootstrap switches (in the non-limiting example of FIG. 1 represented as FET transistors) may be arranged between the second bias voltage node VB2 and the third bias voltage node VB3. The current paths of the active bootstrap switches M4, M5 may be connected (e.g. directly) to a third intermediate node Z, with the node Z short circuited to the second intermediate node Y. The first M4 and second M5 active bootstrap switches may be selectively activatable by a first monostable signal BC1 and a second monostable signal BC2, respectively, which may follow the on/off switching of the control signal C.

In one or more embodiments, wherein the first M4 and second M5 active bootstrap switches may comprise switching transistors, a first monostable signal BC1 and a second monostable signal BC2 may be applied to the control terminals thereof, respectively.

In one or more embodiments, a first C1 and second C2 capacitor may be introduced in order to compensate distortion on the bias voltages, e.g. the first and second bias voltages, that may be caused by stray capacitors Cgd and Cgs (active on the current source transistor M1 and the cascode transistor M3), respectively, during the activation/deactivation of the current source. The first capacitor C1 and the second capacitor C2 may be used to compensate at first order a charge sharing related to charge/discharge of the stray capacitances Cgd and Cgs. The charge sharing related to the stray capacitors Cgd and Cgs may interfere with the transient of the output current Iout and operation of the current source transistor M1 and the cascode transistor M3, respectively.

The current source transistor M1 may have a stray capacitance Cgd between its control terminal and its current path, at the first intermediate node X towards the cascode transistor M3, and the cascode transistor M3 may have a second stray capacitance Cgs between its control terminal and its current path at the second intermediate node Y towards the current source transistor M1.

In one or more embodiments, the first capacitor C1 may be arranged between the control terminal of the cascode transistor M3 and to a control signal C node, and the second capacitor C2 may be arranged between the control terminal of the current source transistor M1 and to a node reproducing an inverted replica $\overline{C}$ of the control signal C.

Accordingly, the control signal C may be applied to the electronic switch M2 (e.g. to the control terminal of the switching transistor M2) plus to the second capacitor C2, while an inverted replica $\overline{C}$ of the control signal C may be applied to the first capacitor C1. Also, the monostable signals BC1 and BC2, which may be synchronized to the control signal C, may be used to selectively active the first and second bootstrap switches M4 and M5, respectively.

In one or more embodiments, the active bootstrap switches, M4 or M5, may be selectively activatable to a conductive state to provide charge transfer current paths coupled to the first and second stray capacitances Cgs, Cgd by coupling the second intermediate node Y to the third bias voltage node VB3 or the second bias voltage node VB2, respectively.

Figure 2:
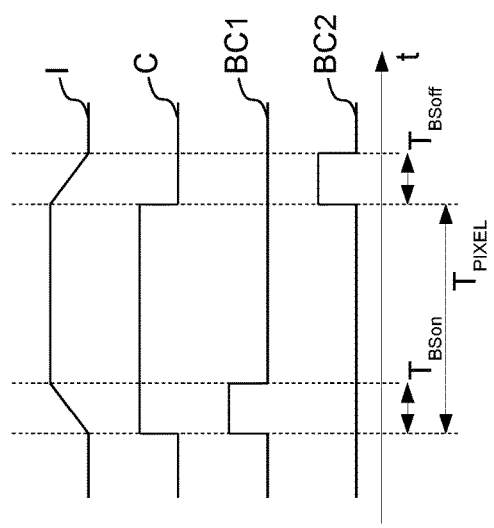
FIG. 2 represents driving and output signals according to one or more embodiments.

FIG. 2 is a non-limiting example of a behavior over time of the output current signal I, the control signal C plus monostable signals BC1 and BC2.

In one or more embodiments, the control signal C and the monostable signals BC1 and BC2 may be on-off digital signals, e.g. switching between a high value (e.g. 1) and a low value (e.g. 0) in order to produce the output current I, that may also switch between a high and low value following the switching of the control signal C.

In one or more embodiments, during an on-switch of the control signal C, the output current I may begin to rise from its low value, and, after a rising transient, the output current I may remain at its high value.

The control signal C may remain at its high value for a time period Tpixel.

In one or more embodiments, at the end of the rising transient of the output current I, a time interval (e.g. Tpixel–$T_{BSon}$) may elapse during which the output current I and the control signal C may remain high, while the first and second monostable signals BC1 and BC2 may remain at the low values thereof.

In one or more embodiments, during an off-switch of the control signal C, the output current I may begin to fall from its high value, and, after a falling transient, the output current I may remain at its low value.

The first BC1 and second BC2 monostable signals may be synchronized to the control signal C: for example, also the monostable signals BC1, BC2 may be synchronized to the switching of the control signal C. For example, to avoid requiring separate high frequency clocks for the monostable, a delay chain may be used in order to provide such a high frequency (in respect of Fpixel=1\Tpixel) controlling signals for the active bootstrap.

In one or more embodiments, the first monostable (digital) signal BC1 may switch to its high value when a rising edge of the control signal C occurs, and may switch back to its low value after a first time interval $T_{BSon}$ has elapsed, that may substantially correspond to the rising transient of the output current I; conversely, the second monostable (digital) signal BC2 may switch to its high value when a falling edge of the control signal C occurs, and may switch back to its low value after a second time interval $T_{BSoff}$ has elapsed, that may substantially correspond to the falling transient of the output current I.

In one or more embodiments, the first time interval $T_{BSon}$ and the second time interval $T_{BSoff}$ may be of equal duration.

Therefore, the active bootstrap switches, M4 or M5, may become active, i.e. conductive, when a high value of the respective mono-stable signals, BC1 or BC2, occur, and remain non-conductive otherwise.

Accordingly, in one or more embodiments, the first active bootstrap switch M4 may selectively connect the second intermediate node Y to the third bias voltage node VB3, e.g. the second intermediate node Y and the third bias voltage node VB3 may be short circuited when the first active bootstrap switch M4 is made conductive. As already discussed, the third bias voltage at the third bias voltage node VB3 may be provided as a replica of the voltage at the second intermediate node Y when the current source transistor M1 is active, i.e. conductive.

Also, the second active bootstrap switch M5 may selectively connect the second intermediate node Y to the second bias voltage node VB2, e.g. the second intermediate node Y and the second bias voltage node VB2 may be short circuited when the second active bootstrap switch M5 is made conductive.

In one or more embodiments, at the beginning of an on switch, i.e. both the control signal C and first monostable signal BC1 may be high, the voltage at the nodes X and Y may be substantially the same (i.e. the electronic switch M2 is conductive, short circuited), and the stray capacitors Cgd and Cgs may be discharged and charged, respectively, by the current generated by the current source transistor M1.

Due to the stray capacitances, a high settling time may be needed for the first and second intermediate nodes X and Y, and a high rising time would result for the output current Iout. However, thanks to the presence of the first active bootstrap transistor M4 being conductive (i.e. having current path being a short circuit), the first and second intermediate nodes X and Y may be short circuited to the desired third bias voltage via the third bias voltage node VB3, which, as already discussed, may provide a low impedance replica of the DC voltage that may be present at the second intermediate node Y when the current generator is active, i.e. conductive.

The third bias voltage may lead to a discharge and charge, respectively, of stray capacitors Cgd and Cgs at the beginning of the transient of the control signal C.

Accordingly, the first monostable signal BC1 remains high (e.g. 1) for the time interval $T_{BSON}$ that may include one or more of:
the rising time of the control signal, and/or
a discharge time for the second stray capacitance Cgd, and/or
a charge time for the first stray capacitance Cgs.

In one or more embodiments, at the beginning of an off switch, i.e. when the control signal C falls to a low value and the second monostable signal BC2 becomes high, the second active bootstrap transistor M5 becomes conductive (i.e. the current path becomes a short circuit) and short circuits the second intermediate node Y to the control terminal of the cascode transistor M3, thereby connecting the second intermediate node Y to the second bias voltage node VB2 (e.g. short circuiting the first stray capacitance Cgs). Accordingly, the second active bootstrap transistor M5 may discharge the first stray capacitance Cgs at the beginning of the falling transient of the output current $I_{out}$, switching off the cascode transistor M3, and therefore the first stray capacitance Cgs is not discharged through the output current Iout (leading to a high settling time for the second intermediate node Y and a high falling time for the output current Iout).

Accordingly, the second monostable signal BC2 remains high (e.g. 1) for the time interval $T_{BSOFF}$ that may include one or more of:
the falling time of the control signal, and/or
a discharge time for the first stray capacitance Cgs, and/or
a partial or complete discharge time for the second intermediate node Y.

In one or more embodiments, the source current transistor M1, the electronic switch M2, the cascode transistor M3 and the two active bootstrap transistors M4, M5 may be field effect transistors, e.g. n-channel MOSFET transistors. Accordingly, the control terminal may comprise a gate terminal and the current path plus first and second terminals may comprise a source-drain channel plus source and drain terminals of the MOSFET. Also, in one or more embodiments, the bulk of each MOSFET transistor may be connected to ground GND.

Figure 3:
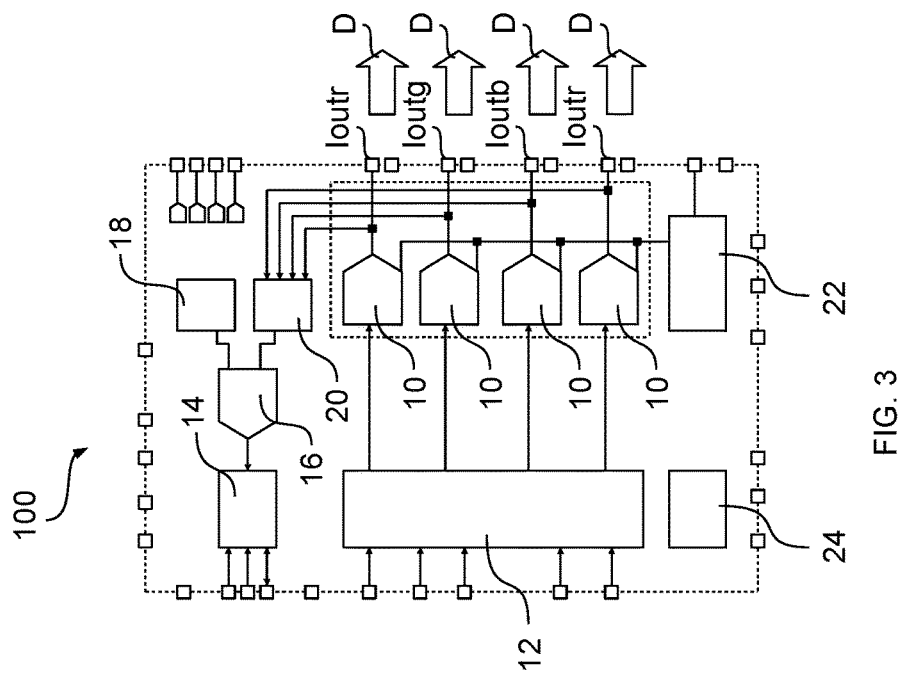
FIG. 3 is exemplary of a device comprising one or more circuits according to one or more embodiments.

FIG. 3 represents a non-limiting example of a device 100, which may comprise one or more circuits 10 according to one or more embodiments.

For instance, according to a general layout which (with the exception of those elements which are discussed in detail herein) can be regarded as conventional in the art, the device 100 may comprise:
output driver channels comprising a circuit 10 according to one or more embodiments, which may generate output currents applied at output nodes IoutR, IoutG, IoutB and IoutR;
a digital interface 12, controlling the output driver channels 10,
a serial peripheral interface SPI 14,
an analog to digital converter ADC 16,
a temperature sensor 18,
a headroom detector 20,
a bandgap and references block 22,
a POR (power on reset) and supply monitor 24.

For example, the output currents at the output nodes IoutR, IoutG, IoutB and IoutR may be used to drive one or more pico-projectors D.

In laser diode driver application, in order to facilitate reducing power consumption, it may be desirable for the circuit 10 to operate at minimum headroom voltage for the current generator, in order to facilitate minimizing the operative voltage on the output current node Iout. Accordingly, the headroom detector 20 may be configured to receive and measure the operative voltages on the output current nodes IoutR, IoutG, IoutB and IoutR of the output driver channels, in order to facilitate adjusting such operative voltage in a dedicated feedback that may comprise an external voltage supply for the laser diodes D.

However, operating at low headroom voltages may lead to one or more disadvantages, as previously outlined, e.g. devices operating in weak inversion and/or high values of stray capacitances.

One or more embodiments may thus present one or more advantages with respect to the prior art, e.g. improvement of static performance:
power consumption: there may be no idle consumption insofar as a complete switch off may be achieved in the off condition,
the possibility exists to manage a wide range output current full-scale, while maintaining the described advantages.

Also, one or more embodiments may improve dynamic performance with respect to the prior art:
it may lead to a faster rise time due to the first bootstrap switch,
it may lead to a faster fall time due to the second bootstrap switch,
it may lead to a faster settling time due to the circuit and the introduced capacitors.

Also, one or more embodiments may facilitate obtaining such performance for various (possibly all) values of the output current $I_{OUT}$. For instance, according to one or more embodiments, the first and second capacitors C1 and C2 may have different values in order to be able to set a desired value depending on the output current Iout full scale.

One or more embodiments may thus relate to a circuit (e.g. 10) which may comprise:
- a first transistor (e.g. M1) and a second transistor (e.g. M3) having respective control terminals and current paths therethrough, the control terminal of the first transistor coupled to a first bias voltage node (e.g. VB1) and the control terminal of the second transistor coupled to a second bias voltage node (e.g. VB2),
- a first electronic switch (e.g. M2) having a selectively activatable current path therethrough, wherein the current paths through the first and second transistor and the current path through the first electronic switch may be cascaded in an output current line between a circuit output node (e.g. Iout) and ground (e.g. GND), the output current line having an intermediate portion (e.g. a portion of the output current line between the first and second intermediate nodes X, Y) between the first and second transistor with a charge transfer node (e.g. Y) in the intermediate portion.

The circuit may comprise:
- a second electronic switch (e.g. M4) arranged between a third bias voltage node (e.g. VB3) and the charge transfer node, and
- a third electronic switch (e.g. M5) arranged between the charge transfer node and the control terminal of the second transistor, the second electronic switch and the third electronic switch selectively (e.g. via signals BC1, BC2) activatable to a conductive state to provide charge transfer current paths coupling the charge transfer node to the third bias voltage input node or the second bias voltage input node, respectively.

In one or more embodiments, the first electronic switch may be arranged in the portion of the output current line between the first transistor and the second transistor.

In one or more embodiments, the first electronic switch may be arranged in a respective portion of the output current line between the circuit output node and the second transistor or between the first transistor and ground.

In one or more embodiments, the circuit may comprise at least one of:
- a first capacitor (e.g. C1) between the control terminal of the first transistor and a node sourcing an inverted replica (e.g. $\overline{C}$) of the control signal, and/or
- a second capacitor (e.g. C2) between the control terminal of the third transistor and a node sourcing the control signal.

In one or more embodiments, the first and second transistor and the first, second and third electronic switches may comprise field effect transistors, such as MOSFET transistors, having gate control terminals and source-drain current paths therethrough.

Also, in one or more embodiments, the first and second transistor and the first, second and third electronic switches may comprise field effect transistors having their bulk terminals coupled to ground.

One or more embodiments may also relate to a device (e.g. 100) which may comprise:
- at least one circuit (e.g. 10) according to one or more embodiments, which may be configured to provide an output current (e.g. I) via the output current line between the output node and ground of the at least one circuit, and
- at least one driver circuit (e.g. 12) coupled to the at least one circuit to provide the control signal to selectively activate the first switch as well as activation signals (e.g. BC1, BC2) to selectively activate the second switch and the third switch.

One or more embodiments may also relate to a system which may comprise:
- the device according to one or more embodiment, and
- at least one user component, optionally a laser diode (e.g. D), coupled to the device to receive therefrom the at least one output current.

One or more embodiments may further relate to a method of driving any of the circuit, the device or the system of one or more embodiments, the method may comprise:
- selectively activating the first electronic switch to the conductive state synchronously with an on-off control signal (e.g. C) having rising edges and falling edges, and
- selectively activating the second electronic switch and the third electronic switch to the conductive state synchronously with the rising edges and falling edges of the on-off control signal selectively activating the first electronic switch.

Also, the method may comprise:
- activating the second electronic switch to the conductive state at the rising edges of the on-off control signal selectively activating the first electronic switch, and
- activating the second electronic switch to the conductive state at the falling edges of the on-off control signal selectively activating the first electronic switch.

The method may further comprise maintaining the second electronic switch and the third electronic switch to a non-conductive state over an interval between the rising edges and the falling edges of the on-off control signal selectively activating the first electronic switch.

Without prejudice to the underlying principles, the details and embodiments may vary, even significantly, with respect to what has been disclosed by way of example only, without departing from the extent of protection.

The extent of protection is defined by the annexed claims. The claims are an integral portion of the disclosure of the invention as provided herein.

The invention claimed is:

1. A circuit, comprising:
a first transistor and a second transistor having respective control terminals and current paths therethrough, the control terminal of the first transistor coupled to a first bias voltage node and the control terminal of the second transistor coupled to a second bias voltage node;
a first electronic switch having a selectively activatable current path therethrough,
wherein the current paths through the first and second transistor and the current path through the first electronic switch are cascaded in an output current line between a circuit output node and ground, the output current line having an intermediate portion between the first and second transistor with a charge transfer node in the intermediate portion;
a second electronic switch arranged between a third bias voltage node and the charge transfer node; and
a third electronic switch arranged between the charge transfer node and the control terminal of the second transistor;

wherein the second electronic switch and the third electronic switch are selectively activatable to a conductive state to provide charge transfer current paths coupling the charge transfer node to the third bias voltage node or the second bias voltage node, respectively.

2. The circuit of claim 1, wherein the first electronic switch is arranged in said intermediate portion of the output current line between the first transistor and the second transistor.

3. The circuit of claim 1, comprising at least one of:
a first capacitor between the control terminal of the first transistor and a node sourcing an inverted replica of said control signal, and
a second capacitor between the control terminal of the third transistor and a node sourcing said control signal.

4. The circuit of claim 1, wherein the first and second transistors and the first, second and third electronic switches comprise field effect transistors having gate control terminals and source-drain current paths therethrough.

5. The circuit of claim 1, wherein the first and second transistors and the first, second and third electronic switches comprise field effect transistors having bulk terminals coupled to ground.

6. The circuit of claim 1, wherein:
the first electronic switch is selectively activated to the conductive state synchronously with an on-off control signal having rising edges and falling edges, and
the second electronic switch and the third electronic switch are selectively activated to the conductive state synchronously with the rising edges and falling edges of the on-off control signal selectively activating the first electronic switch.

7. The circuit of claim 6, wherein:
the second electronic switch is activated to the conductive state at the rising edges of the on-off control signal selectively activating the first electronic switch, and
the second electronic switch is activated to the conductive state at the falling edges of the on-off control signal selectively activating the first electronic switch.

8. The circuit of claim 6, wherein the second electronic switch and the third electronic switch are maintained in a non-conductive state over an interval between the rising edges and the falling edges of the on-off control signal selectively activating the first electronic switch.

9. A circuit, comprising:
a current source circuit comprising:
a first transistor and a second transistor having respective control terminals and current paths therethrough, the control terminal of the first transistor coupled to a first bias voltage node and the control terminal of the second transistor coupled to a second bias voltage node;
a first electronic switch having a selectively activatable current path therethrough,
wherein the current paths through the first and second transistor and the current path through the first electronic switch are cascaded in an output current line between a circuit output node and ground, the output current line having an intermediate portion between the first and second transistor with a charge transfer node in the intermediate portion;
a second electronic switch arranged between a third bias voltage node and the charge transfer node; and
a third electronic switch arranged between the charge transfer node and the control terminal of the second transistor;

wherein the second electronic switch and the third electronic switch are selectively activatable to a conductive state to provide charge transfer current paths coupling the charge transfer node to the third bias voltage node or the second bias voltage node, respectively; and
wherein the output current line provides an output current; and
a driver circuit coupled to said current source circuit and configured to provide the control signal to selectively activate the first switch as well as activation signals to selectively activate the second switch and the third switch.

10. The circuit of claim 9, further comprising a user component coupled to receive said output current.

11. The circuit of claim 10, wherein the user component is a laser diode.

12. The circuit of claim 9, wherein the first electronic switch is arranged in said intermediate portion of the output current line between the first transistor and the second transistor.

13. The circuit of claim 9, comprising at least one of:
a first capacitor between the control terminal of the first transistor and a node sourcing an inverted replica of said control signal, and
a second capacitor between the control terminal of the third transistor and a node sourcing said control signal.

14. The circuit of claim 9, wherein the first and second transistors and the first, second and third electronic switches comprise field effect transistors having gate control terminals and source-drain current paths therethrough.

15. The circuit of claim 9, wherein the first and second transistors and the first, second and third electronic switches comprise field effect transistors having bulk terminals coupled to ground.

16. The circuit of claim 9, wherein:
the first electronic switch is selectively activated to the conductive state synchronously with an on-off control signal having rising edges and falling edges, and
the second electronic switch and the third electronic switch are selectively activated to the conductive state synchronously with the rising edges and falling edges of the on-off control signal selectively activating the first electronic switch.

17. The circuit of claim 16, wherein:
the second electronic switch is activated to the conductive state at the rising edges of the on-off control signal selectively activating the first electronic switch, and
the second electronic switch is activated to the conductive state at the falling edges of the on-off control signal selectively activating the first electronic switch.

18. The circuit of claim 16, wherein the second electronic switch and the third electronic switch are maintained in a non-conductive state over an interval between the rising edges and the falling edges of the on-off control signal selectively activating the first electronic switch.

19. A circuit, comprising:
a current source transistor having a control terminal biased by a first bias voltage;
a cascode transistor having a control terminal biased by a second bias voltage;
a first switching transistor having a control terminal coupled to receive a first digital control signal;

wherein conduction paths of the current source transistor, cascode transistor and first switching transistor are coupled in series;

a second switching transistor having a conduction path coupled between a third bias voltage and an intermediate node between the cascode transistor and the first switching transistor and having a control terminal coupled to receive a second digital control signal; and a third switching transistor having a conduction path coupled between the intermediate and the control terminal of the cascode transistor and having a control terminal coupled to receive a third digital control signal.

20. The circuit of claim 19, wherein the first digital control signal has a first edge and a second edge, wherein the second digital control signal activates the second switching transistor synchronously with the first edge, and wherein the third digital control signal activates the third switching transistor synchronously with the second edge.

21. The circuit of claim 19, further comprising:

a first capacitor having a first terminal coupled to the gate terminal of the current source transistor and a second terminal coupled to receive a logic inverse of the first digital control signal; and a second capacitor having a first terminal coupled to the gate terminal of the cascode transistor and a second terminal coupled to receive the first digital control signal.

22. The circuit of claim 19, wherein the current source transistor, cascode transistor, first switching transistor, second switching transistor and third switching transistor are all MOSFET transistors of n-channel type.

23. The circuit of claim 22, wherein body terminals of the MOSFET transistors are connected to ground.

24. The circuit of claim 19, wherein the conduction paths of the current source transistor, cascode transistor and first switching transistor are coupled in series to form an output current line.

* * * * *